(12) United States Patent
Koechlin et al.

(10) Patent No.: US 9,417,134 B2
(45) Date of Patent: Aug. 16, 2016

(54) MICROBOLOMETER ARRAY WITH IMPROVED PERFORMANCE

(75) Inventors: Charlie Koechlin, Bourg la Reine (FR); Patrick Bouchon, Antony (FR); Riad Haidar, Paris (FR); Jean-Luc Pelouard, Paris (FR); Jean-Jacques Yon, Sassenage (FR); Joël Deschamps, Marcoussis (FR); Fabrice Pardo, Vitry sur Seine (FR); Stéphane Collin, Cachan (FR)

(73) Assignees: Centre Nationale de la Recherche Scientifique—CNRS, Paris (FR); Office Nathional d'Etudes et de Recherches Aerospatiales—ONERA—Chemie de la Huniere, Palaiseau (FR); Commissariat à l'énergie atomique et aux énergies alternatives—CEA, Paris (FR)

( * ) Notice: Subject to any disclaimer, the term of this patent is extended or adjusted under 35 U.S.C. 154(b) by 418 days.

(21) Appl. No.: 14/131,298

(22) PCT Filed: Jul. 13, 2012

(86) PCT No.: PCT/EP2012/063771
§ 371 (c)(1),
(2), (4) Date: Apr. 23, 2014

(87) PCT Pub. No.: WO2013/010933
PCT Pub. Date: Jan. 24, 2013

(65) Prior Publication Data
US 2014/0226021 A1    Aug. 14, 2014

(30) Foreign Application Priority Data
Jul. 15, 2011    (FR) ..................................... 11 56461

(51) Int. Cl.
*H04N 5/33*    (2006.01)
*G01J 5/20*    (2006.01)
(Continued)

(52) U.S. Cl.
CPC .... *G01J 5/20* (2013.01); *G01J 5/08* (2013.01); *G01J 5/0853* (2013.01); *H01L 27/14685* (2013.01); *H04N 5/33* (2013.01); *G01J 2005/204* (2013.01)

(58) Field of Classification Search
None
See application file for complete search history.

(56) References Cited

U.S. PATENT DOCUMENTS 4,287,484 A * 9/1981 Wang ..................... H01S 3/031
372/23

(Continued)

FOREIGN PATENT DOCUMENTS

FR      2 940 522 A1      6/2010
WO      02/055973 A2      7/2002

OTHER PUBLICATIONS

International Search Report for corresponding International Application No. PCT/EP2012/063771, mailed Sep. 13, 2012 (2 pages).
(Continued)

*Primary Examiner* — Tracy Li
(74) *Attorney, Agent, or Firm* — Osha Liang LLP

(57) ABSTRACT

According to one aspect, the invention relates to a microbolometer array for thermal detection of light radiation in a given spectral band, comprising a supporting substrate and an array of microbolometers (300) of given dimensions, arranged in an array. Each of said microbolometers comprises a membrane (301) suspended above said supporting substrate, said membrane consisting of an element (305) for absorbing the incident radiation and a thermometric element (304) in thermal contact with the absorber, electrically insulated from said absorber element. The absorber element comprises at least one first metal/insulator/metal (MIM) structure comprising a multilayer of three superposed films of submicron-order thickness i.e. a first metallic film (311), a dielectric film (310), and a second metallic film (309), said MIM structure being able to have a resonant absorption of said incident radiation at at least one wavelength in said spectral band. The area of the microbolometer pixel covered by said membrane (301) is less than or equal to half of the total area of the microbolometer pixel.

17 Claims, 12 Drawing Sheets

(51) Int. Cl.
*G01J 5/08* (2006.01)
*H01L 27/146* (2006.01)

(56) References Cited

U.S. PATENT DOCUMENTS

| | | | |
|---|---|---|---|
| 5,760,398 A | 6/1998 | Blackwell et al. | |
| 2007/0019314 A1* | 1/2007 | Fuller | G21F 1/10 359/885 |
| 2009/0029495 A1* | 1/2009 | Li | H01L 33/405 438/29 |
| 2011/0266443 A1* | 11/2011 | Schimert | G01J 1/02 250/338.4 |
| 2011/0266445 A1* | 11/2011 | Beratan | G01J 1/02 250/338.4 |

OTHER PUBLICATIONS

Written Opinion for corresponding International Application No. PCT/EP2012/063771, mailed Sep. 13, 2012 (6 pages).

International Preliminary Report on Patentability for corresponding International Application No. PCT/EP2012/063771, mailed Oct. 22, 2013 (20 pages).

* cited by examiner

SECTION B-B

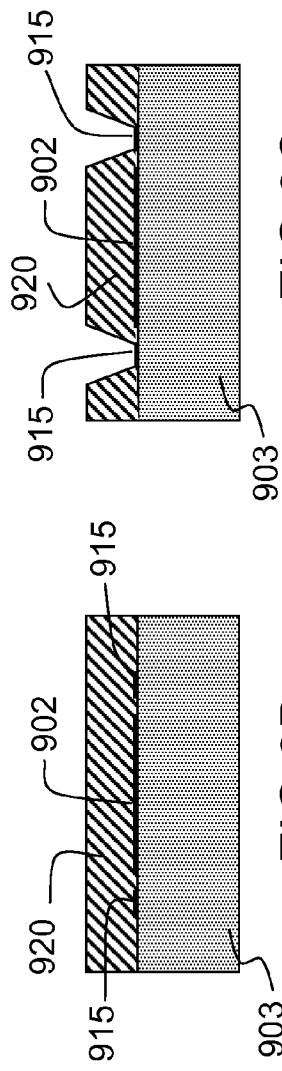
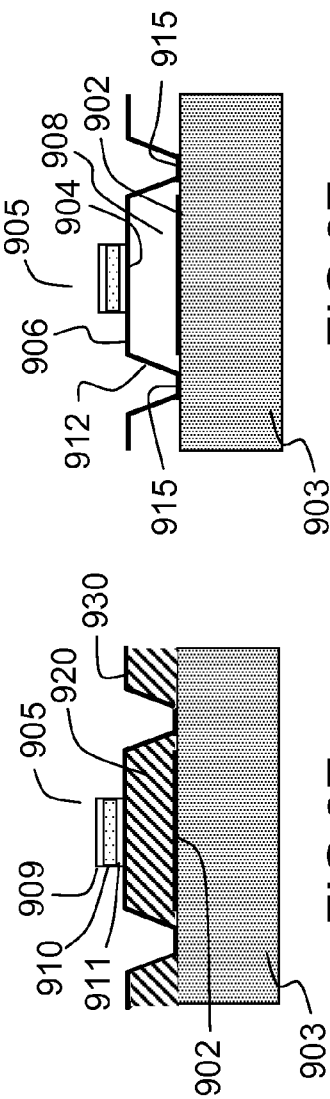
FIG.9A
FIG.9B
FIG.9C
FIG.9D
FIG.9E
FIG.9F

MICROBOLOMETER ARRAY WITH IMPROVED PERFORMANCE

TECHNICAL FIELD OF THE INVENTION

The present invention relates to a microbolometer array with improved performance, especially for detecting radiation in the infrared.

PRIOR ART

Uncooled infrared detectors have for several decades been the subject of intense research and development. Among such detectors, the market for resistive microbolometers is, at the present time, experiencing substantial growth, especially for civil applications (home electronics, driver or pilot assistance, night vision, fire investigation, etc.). Resistive microbolometers are particularly suited to detection in the infrared, and more particularly to detection in band III (8-12 µm), corresponding to one of the spectral bands that is transmitted through the atmosphere allowing heat emitted by objects at room temperature or by living creatures to be observed.

A microbolometer array, intended to be used in a camera, may be fabricated in the form of an array of detecting elements, called in the rest of the description "microbolometer pixels". The microbolometer arrays are essentially used for infrared thermal imaging (wavelengths lying in bands II and III of the infrared, respectively between 3-5 and 8-12 µm). They have two major advantages over imagers based on quantum detectors. On the one hand they operate at room temperature, which makes it possible to reduce considerably their manufacturing cost and the running cost of cameras using them. On the other hand, they are fabricated in a technology compatible with that of silicon microelectronics, thereby allowing the arrays to be produced directly on the read-out circuit produced in CMOS technology. Microtechnology techniques and direct connection to the read-out circuit allow very low-cost production of large microbolometer arrays (typically 1024×768). By combining these two advantages, microbolometer arrays enable infrared imaging at a much lower cost than was possible with imagers based on quantum detectors. Thus, microbolometer arrays marketed at the present time are produced using a mature technology that has seen the performance obtained from the intrinsic capacities of these microbolometer arrays pushed to extremes. In particular, they are capable of absorbing more than 90% of the incident radiation in the 8-12 µm spectral band and their fill factor, i.e. the ratio of the sensitive area to the total area of the array of detectors, is near 100%. Despite these performances, microbolometer arrays are disadvantaged over cooled technologies by their limited sensitivity and slow response time.

FIGS. 1A, 1B and 1C show schematic views of microbolometer pixels according to the prior art.

As shown in FIG. 1A, the microbolometer pixel 100 chiefly comprises a membrane 101 forming an absorber/thermistor assembly, with an absorber element and a thermometric element or thermistor in very good thermal contact with the absorber element, and a supporting substrate 103 above which the membrane 101 is suspended. It also comprises thermally insulating arms 106 and electrically connecting elements 114 for electrically connecting the thermometric element with pads 115 on the support substrate. The supporting substrate, for example made of silicon, provides the microbolometer pixel with mechanical rigidity and comprises circuits (not shown in FIG. 1) for biasing and reading the resistance of the thermometric element. The absorber/thermistor assembly is suspended above the supporting substrate 103 by anchoring elements, which in the example in FIG. 1 are also the electrically connecting elements 114. Absorption of the flux of incident photons in the absorber tends to increase its temperature. The thermistor enables electrical measurement of this temperature variation. Thermally insulating the absorber/thermistor assembly from its supporting substrate (by means of the thermally insulating arms and the insulating vacuum maintained around the absorber/thermistor assembly) increases the sensitivity of the device by increasing, for a given photon flux, the increase in temperature of the absorber/thermistor unit.

FIGS. 1B and 1C respectively show a schematic top view and a schematic cross-sectional view of another known microbolometer pixel. The membrane 101 forming the absorber/thermistor unit is suspended above the supporting substrate 103 by means of anchoring elements (not shown) and thermally insulating arms 106 that also form elements electrically connecting to connection pads 115 on the supporting substrate. In this example, the membrane 101 forming the absorber/thermistor unit comprises, on one side, an absorbing element 105 (FIG. 1C) and, on the other side, a thermometric element 104 making very good thermal contact with the absorber. The absorber in conventional technologies consists of a thin metal film. The thermistor is generally a resistor made from a material chosen for its high resistivity variation with temperature, such as for example a vanadium oxide ($VO_x$) or amorphous silicon (a-Si). The thermally insulating arms are for example low-thermal-conductivity mechanical and electrical links that suspend the absorber/thermistor assembly in an insulating vacuum.

Each microbolometer pixel in a microbolometer array is then separated from its neighbours by a thermally and electrically insulating margin. The microbolometer pixels are therefore insensitive to the incident photon flux over some of their area, consisting of the thermally insulating arms, the elements electrically connecting to the supporting substrate and the insulating margin. The effect on the sensitivity of the microbolometer pixel of the presence of this area insensitive to the incident flux is given by the fill factor, defined in the present description by the ratio of the area of the absorbing area 107 (which is that of the membrane 101 forming the absorber/thermistor unit in the example of FIG. 1B) to that of the total area of the microbolometer pixel (represented by the frame 113 in FIG. 1B).

It can be shown, to a first approximation, that the temperature change $\Delta T$ (in kelvin) quantifying the steady-state temperature increase of the thermometric element under the action of the incident flux, and the response time $\tau$ of the microbolometer pixel (in seconds) are given by:

$$\Delta T = \eta \cdot A \cdot R_{th} \cdot P \qquad \text{(Equation 1)}$$

$$\tau = C_{th} \cdot R_{th} \qquad \text{(Equation 2)}$$

where $\eta$, having a value strictly between 0 and 1, is the proportion of the incident light energy absorbed by the absorber element, P is the light power flow (in $W/m^2$), A is the area of the membrane, $C_{th}$ is the heat capacity of the thermometric element (in J/K), $R_{th}$ is the thermal resistance (in K/W) of all of the elements connecting the thermometric element and the supporting substrate thermally and especially that of the thermally insulating arms.

The temperature change ($\Delta T$) quantifies the temperature increase of the membrane under the action of the incident light flux. It is converted into an electrical signal by the thermistor. The electrical signal measured is therefore proportional to the light power flow on the absorbing area of the microbolometer pixel and to a factor, called the "response" of the microbolometric pixel, which is proportional to the thermal resistance $R_{th}$. The sensitivity of the microbolometer pixel, which represents the smallest detectable difference in light flux, depends to a first approximation on the response. Increasing the thermal resistance $R_{th}$ thus increases the sensitivity to the detriment of the response time, which also increases.

To the first order, the design of a microbolometer pixel is therefore a compromise between the partition of its area between the area of the membrane forming the absorber/thermistor unit and that of the "thermal insulation" formed by the various thermally insulating elements (for example the thermally insulating arms and the insulating margin). Specifically, the light power flow absorbed is increased by increasing the area of the absorber/thermistor membrane (the product P×A in Equation 1) but the poor thermal insulation (low $R_{th}$) results in a small temperature increase. A contrario, thermal insulation occupying a larger space will be more effective but the number of photons absorbed will decrease. The design of a microbolometer pixel is also constrained by a requirement to minimize the area of the other non-absorbing parts (electrically connecting elements, for example). Thus, state-of-the-art microbolometer arrays with pixels smaller than 20 μm currently have a fill factor near 100% for sensitivities in the infrared of about 45 mK (see for example J. L. Tissot "High performance Uncooled amorphous silicon VGA IRFPA with 17 μm pixel-pitch", Proceedings of SPIE Vol. 7660 76600T-1 (2010)).

It is known to place the membrane forming the absorber/thermistor unit at a distance $d=\lambda_0/4$ away from a mirror 102, $\lambda_0$ being the central wavelength of the spectral detection band, so as to form a quarter-wave cavity allowing high absorption, typically 90% over the whole of the atmospheric-transmission band III ranging from 8 to 12 μm, to be obtained. Such a device is for example described in patent application WO 2002/055973, which discloses a microbolometer array with a wide spectral absorption band.

The article by Maier et al. 2009 ("Wavelength-tunable microbolometers with metamaterial absorbers", Optics letters, Vol. 34, No. 19) in contrast describes a microbolometer array having a controlled spectral selectivity. The microbolometer thus described comprises a thermometric element formed by an amorphous-silicon film between two silicon-nitride films, the film being covered with a set of absorber elements consisting of square metal/insulator/metal multilayers arranged in a two-dimensional array and exhibiting resonant absorption in the infrared. The metal/insulator/metal (MIM) multilayer allows, via the choice of the lateral dimensions of each absorber element, plasmon resonances to be excited at given wavelengths in the spectral band, thus providing the microbolometer array with spectral selectivity. This spectral selectivity is, however, achieved to the detriment of sensitivity, absorption being limited to part of the spectral band of the incident radiation, and to the detriment of response time, the thermal mass to be heated having increased.

The article by Maier et al. 2010 ("Multispectral microbolometers for the midinfrared", Optics letters, Vol. 35, No. 22) also describes a microbolometer array using plasmon resonances. FIG. 2 shows a schematic view of a membrane forming the absorber/thermistor unit in a microbolometer pixel as described in this article. The membrane 201 comprises a thermometric element 204 and an absorber element 205 formed of a MIM multilayer, wherein the absorber element comprises a continuous metallic layer in contact with the thermometric element 204, a dielectric layer and a top metal layer whose lateral dimensions define the resonance wavelength and consequently, the spectral response of the microbolometer array. In comparison with the article by Maier et al. 2010, the arrangement of a metallic continuous layer that completely covers the pixel area enables to increase the absorption of the microbolometer. However, the arrangement of continuous dielectric and metallic layers over the whole pixel area increases the thermal mass. Further, as in Maier et al. 2009, the spectral filtering induced by the MIM resonators is achieved to the detriment of the sensitivity of the microbolometer pixel.

Yet, the current market trend to pixel sizes approaching the wavelength means that the sensitivity of the microbolometer array is of greater importance. Faced with the new constraints imposed by infrared imaging applications (home electronics, night vision, fire detection, etc.), both in terms of sensitivity and pixel size, there is, at the present time, a real need for a technological breakthrough to increase potential of microbolometer arrays while maintaining all their advantages, especially their ability to operate at room temperature and their low cost.

One object of the present invention is to provide a microbolometer array in which the photons incident on each of its microbolometer pixels are absorbed by MIM structures, and the design of which allows the coupling of the absorber and the incident wave to be drastically modified in order to allow the area occupied by the thermal insulator to be increased while maintaining a fill factor near 1. This conceptual breakthrough allows the compromise between the optical absorption and the thermal insulation and mass to be redefined so as to improve the sensitivity and/or the response time of the microbolometer array. Another object of the invention is to allow microbolometer pixels that are very small (typically about a wavelength) in size to be produced since it is impossible to achieve such pixel sizes with current technologies if a good sensitivity is required.

SUMMARY OF THE INVENTION

According to a first aspect, the invention relates to a microbolometer array for thermal detection of light radiation in a given spectral band, comprising a supporting substrate and an array of microbolometer pixels of given dimensions, wherein each microbolometer pixel comprises:
  a membrane suspended above said supporting substrate by supporting elements, said membrane consisting of an element for absorbing the incident radiation and a thermometric element in thermal contact with the absorber, electrically insulated from said absorber element;
  elements for electrically connecting said thermometric element to the supporting substrate;
  thermally insulating arms arranged between the thermometric element and the supporting substrate;
  and wherein:
  the absorber element comprises at least one first metal/insulator/metal (MIM) structure comprising a multi-layer of three superposed films of submicron-order thickness i.e. a first metallic film, a dielectric film, and a second metallic film, said MIM structure being able to have a resonant absorption of said incident radiation at at least one wavelength in said spectral band; and
  the area of the microbolometer pixel covered by said membrane is less than or equal to half of the total area of the microbolometer pixel.

The effective absorption area of an MIM structure optimized for coupling to a given wavelength is much larger than the real area occupied by said structure. By choosing to limit the area of the microbolometer pixel covered by the membrane to at least half of the total area of the microbolometer pixel, the area of the thermal insulator is increased without decreasing the absorption area. As a result the sensitivity of the microbolometer is increased without increasing the response time, the mass of the thermometric element also being limited.

Further, because of the increase in available space resulting from the small footprint of the membrane formed by the absorber and the thermometric element, it is possible to form thermally insulating arms that are of sufficient length to significantly increase the thermal resistance and thereby increase the sensitivity of the microbolometer. Alternatively, the length of the thermally insulating arms may be decreased so as to limit the response time.

Advantageously, the thermally insulating arms form part of the elements supporting the membrane.

They may also form elements for electrically connecting the thermometric element.

According to one variant embodiment, the thermally insulating arms and/or the thermometric element of each of the microbolometer pixels are/is formed in a structured film.

According to another variant embodiment, the same film may be used to form the thermally insulating arms and/or the thermometric element. In this case, advantageously, the part of the film forming the thermally insulating arms has a higher electrical conductivity than the part of the film forming the thermometric element. This higher electrical conductivity is for example obtained by locally doping the film.

According to another variant embodiment, the thermometric element of each of the microbolometer pixels is structured in the shape of a serpentine that has a length that is much greater than its width, thus allowing its contribution to the total electrical resistance, and thereby the sensitivity of the microbolometer pixels, to be increased.

According to another variant embodiment, the thermometric element of each of the microbolometer pixels comprises a material or a multilayer of materials chosen from amorphous silicon, a vanadium-based compound and an Si—Ge alloy.

According to another variant embodiment, all the microbolometer pixels of the microbolometer array are identical. Alternatively, the microbolometer pixels may be different from one another and comprise MIM structures with different resonant wavelengths, in order to obtain multispectral detectors and/or detectors suited to absorbing incident waves with different polarizations.

According to another variant embodiment, said first MIM structure of at least one of the microbolometer pixels is located substantially in the centre of the microbolometer pixel. It may for example be a substantially square structure the lateral dimension of which is defined by the desired absorption wavelength. The effective absorption area, of the order of the square of the wavelength, is larger than that of the MIM structure and may be adjusted to cover almost all of the area of the microbolometer pixel. It is thus possible to produce a microbolometer array with smaller pixels, typically about the size of the wavelength, with enough space to provide the thermal insulation, the microbolometer array being insensitive to the polarization of the incident wave.

According to another variant embodiment, the absorber element of at least one of the microbolometer pixels may comprise a plurality of said MIM structures, arranged on the surface of the microbolometer pixel.

For example, for a given microbolometer pixel, said structures are identical and distributed over the area of the microbolometer pixel. For example, the MIM structures have a square shape optimized to absorb at a given wavelength of the desired absorption spectrum, allowing a larger microbolometer pixel to be produced, the effective absorption area of all the MIM structures allowing all or almost all of the area of the microbolometer pixel to be covered.

Alternatively, for a given microbolometer pixel, at least two of said MIM structures are different and able to generate, under said incident radiation, a plasmon resonance at at least two separate wavelengths in said spectral band, thus allowing the spectral response of the microbolometer pixel to be "shaped".

According to another variant embodiment, the absorber element of at least one of the microbolometer pixels comprises at least one second MIM structure superposed on said first MIM structure, said first and second structures being able to have a resonant absorption of the incident radiation at at least two separate wavelengths in said spectral band, and sharing a common metallic film. This configuration allows the spectral response of the microbolometer pixel to be shaped, even in the case of small pixels, the structures being stacked, for example in the centre of the pixel.

The MIM structures advantageously have a square shape with a lateral dimension tailored so as to optimize the absorption at a wavelength in the spectral band of interest. In practice, the lateral dimension of said MIM structure is smaller than or equal to $\lambda_{max}/2n$, where $\lambda_{max}$ is the highest wavelength in said spectral band and where n is the refractive index of the dielectric film in said MIM structure. Square MIM structures are insensitive to polarization.

Alternatively, the MIM structures may be rectangular, at least one lateral dimension of said MIM structure being smaller than or equal to $\lambda_{max}/2n$. In this case the structure is sensitive to polarization. The two lateral dimensions may be adjusted to obtain resonant absorption at two separate wavelengths in the spectral band of interest. One will be used to detect waves with TE polarization and the other to detect waves with TM polarization. Alternatively, a single lateral dimension may be adjusted to obtain resonant absorption at a given wavelength, the other lateral dimension for example being much larger, for example about the lateral dimension of the pixel, the detector then being sensitive to only one polarization and thereby forming a polarizing filter.

Other shapes are possible for the MIM structure, for example it may be triangular or hexagonal, making it possible to adjust the polarization response of the detector. Advantageously, in each of these cases, at least one lateral dimension of said MIM structure is smaller than or equal to $\lambda_{max}/2n$.

According to another variant embodiment, the dielectric film of said MIM structure of each of the microbolometer pixels is made from a material having a high refractive index, for example a material chosen from zinc sulphide (ZnS), yttrium trifluoride ($YF_3$), silicon nitride ($SiN_x$), silicon oxide ($SiO_x$), silicon oxynitride ($SiO_xN_y$), amorphous germanium (a-Ge), amorphous silicon (a-Si) and an amorphous alloy of silicon and germanium (a-SiGe).

According to another variant embodiment, the first or second metallic film of said MIM structure of each of the microbolometer pixels is made of a material having low losses in the spectral band of interest, for example a material chosen from gold, copper, aluminum and silver. An adhesion layer, for example made of titanium or chromium, may be provided between the metallic film and the dielectric film so as to ensure better adhesion between these two films.

According to another variant embodiment, the thermometric element is insulated from the absorber by an electrically insulating film Advantageously, each of the microbolometer pixels furthermore comprises a reflector placed at a distance d from the plane of said membrane, so as to form a resonant cavity at said wavelength. Thus, most of the light energy will be absorbed by the structure and the energy lost by transmission will be very small.

According to another variant embodiment, the supporting substrate comprises a circuit for reading the electrical resistance of the thermometric element of each of the microbolometers.

According a second aspect, the invention relates to a camera for detecting infrared radiation comprising image-forming optics, a microbolometer array according to the first aspect located in the vicinity of a focal plane of said optics, and a unit for processing the signals delivered by the circuit for reading the bolometer.

According to a third aspect, the invention relates to a method for producing a microbolometer array according to any one of the preceding claims, comprising:
- depositing a sacrificial film on a supporting substrate;
- forming apertures in said film in the location of elements for anchoring the microbolometers;
- depositing a structured film in order to define, for each microbolometer, the thermometric element and the thermally insulating arms;
- depositing the MIM structure(s) on each of the thermometric elements formed; and
- removing the sacrificial film.

Advantageously, the method comprises, before the sacrificial film has been deposited, a step of depositing a reflective film structured to form, for each of the microbolometers, a reflector element.

BRIEF DESCRIPTION OF THE FIGURES

Other features and advantages of the invention will become apparent on reading the following description, illustrated by the figures which show:

FIGS. 9A to 9F, schematics showing steps of a process for fabricating a microbolometer array, according to an exemplary embodiment of the invention.

DETAILED DESCRIPTION

Figure 1C:
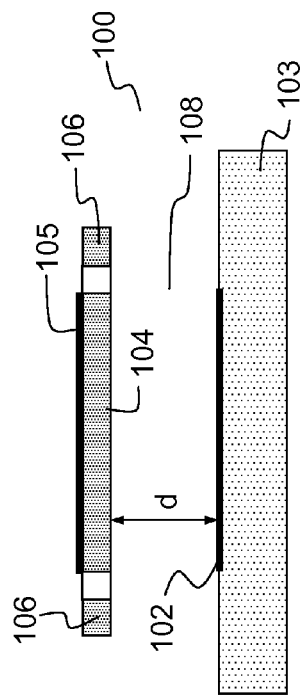
FIGS. 1B and 1C (already described), schematic top and cross-sectional views, respectively, of a microbolometer pixel according to a second example of the prior art.
Figure 2:
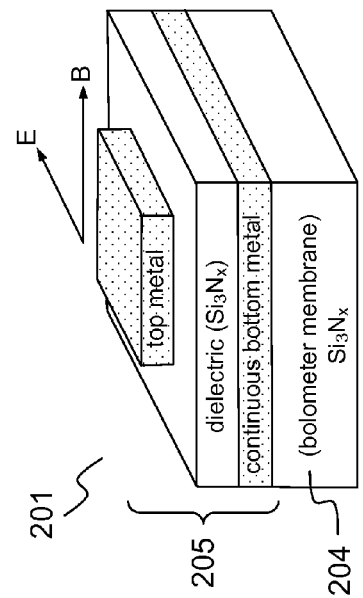
FIG. 2 (already described), a schematic view of an elementary cell of a membrane forming a absorber/thermistor unit in a microbolometer pixel using Plasmon resonances, according to the prior art.
Figure 1A:
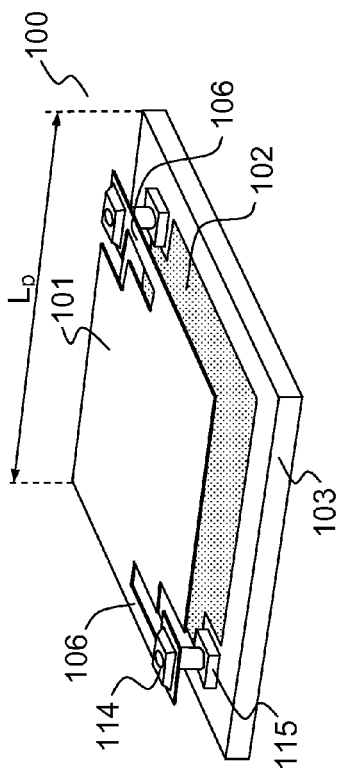
FIG. 1A (already described), a perspective view of a microbolometer pixel according to a first example of the prior art.
Figure 1B:
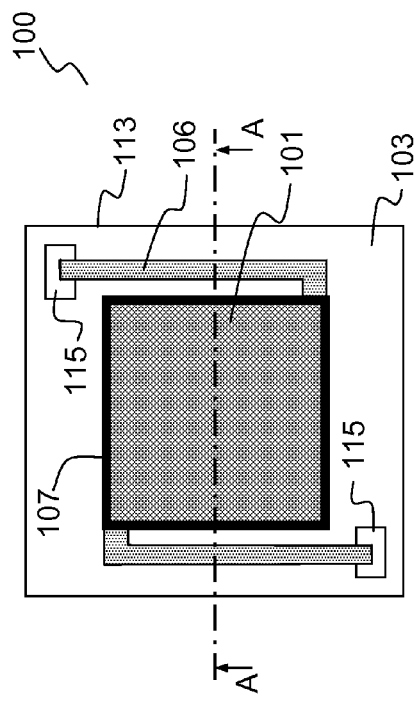
Figure 3A:
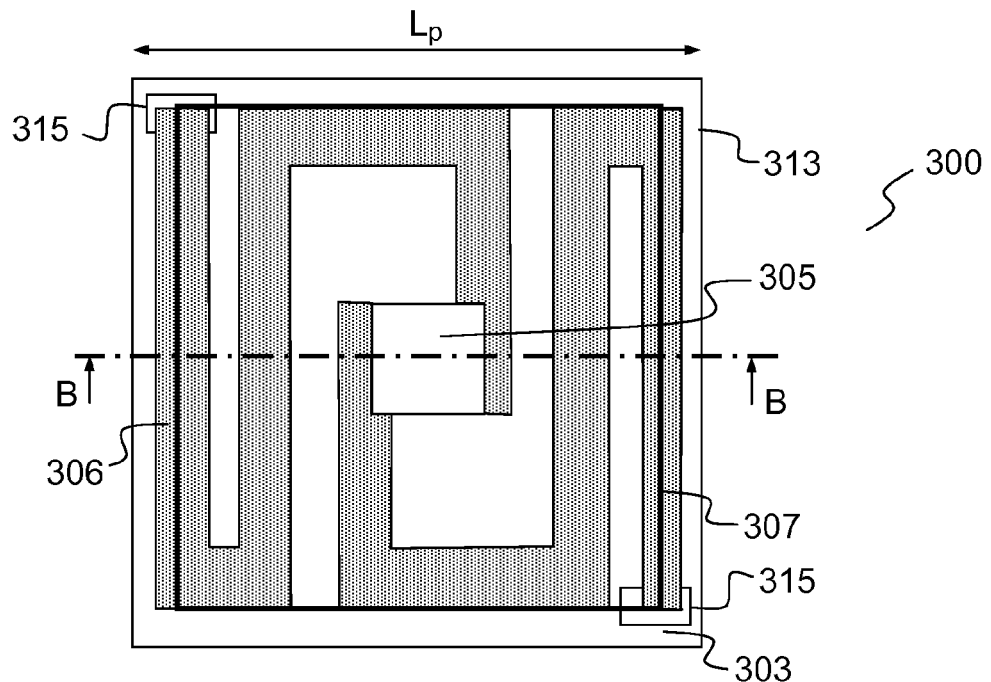
FIGS. 3A and 3B, schematic top and cross-sectional views, respectively, of a microbolometer pixel according to a first embodiment of the invention.
Figure 3B:
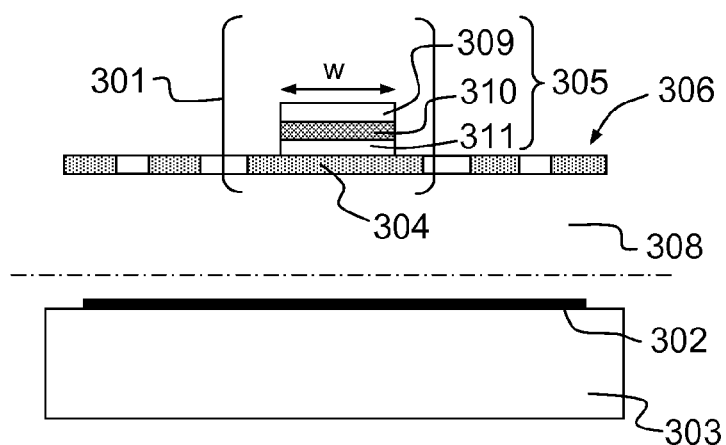

FIGS. 3A and 3B respectively illustrate a top view and a cross-sectional view of a first exemplary microbolometer pixel according to the invention for detecting radiation having a wavelength in a given spectral band, for example in the infrared. The elements shown in the figures of the present description are not shown to scale, so as to make the drawings more legible. The microbolometer pixel 300 comprises a membrane (301, FIG. 3B) that is suspended over a supporting substrate 303 by supporting elements. The membrane 301 is formed by an element 305 for absorbing incident radiation and a thermometric element 302 making thermal contact with the absorber preferably over its whole surface or nearly its whole surface in order to warm up homogeneously, but electrically insulated from it, for example by means of an insulating film, for example made of silicon nitride. The microbolometer pixel 300 advantageously comprises arms 306 for thermally insulating the thermometric element, one of the ends of the arm being connected to the thermometric element and the other being connected to the anchoring point making contact with the supporting substrate. The microbolometer pixel 300 also comprises elements for electrically connecting the thermometric element to the supporting substrate. The supporting substrate 303 is for example made of silicon; it provides the microbolometer pixel with mechanical rigidity and comprises circuits (not shown in FIG. 3) for biasing and reading the resistance of the thermometric element 304. The supporting elements comprise, in the examples of FIGS. 3A and 3B thermally insulating arms 306 and anchoring elements (which cannot be seen in FIGS. 3A and 3B). The anchoring elements advantageously comprise at least one electrically conductive material in order to electrically connect the thermometric element 304 to the electrical connection pads 315 of the read-out circuit. Advantageously, the thermally insulating arms form, with said anchoring elements, elements for electrically connecting the thermometric element to the read-out circuit of the supporting substrate. The frame 313 shows the external outline of the microbolometer pixel, generally square in shape. In practice, the external lateral dimensions of the microbolometer pixels that will be incorporated into a microbolometer array may be given by the ratio of the corresponding dimension of the microbolometer array to the number of microbolometer pixels in the dimension concerned.

In the example of FIG. 3, the absorber element comprises an MIM structure 305 comprising a multilayer of three films, respectively a first metal film 311, a dielectric film 310, and a second metal film 309, these three films being superposed. In the rest of the description, the term "dielectric" is understood to mean a material the permittivity of which has a positive real part and a zero imaginary part or an imaginary part that is very small relative to the real part at the wavelengths of the radiation in the spectral band of interest. The dielectric is therefore transparent or weakly absorbent at the wavelengths in the spectral band concerned. The metals forming the metallic films on either side of the dielectric film are, for their part, metals or materials with a negative permittivity 8 exhibiting low losses at the wavelengths concerned, such as gold, silver, aluminum or copper, for example. Because it is desired to maximize absorption in the absorbing structure, it is acceptable to use a thin adhesion layer, for example made of titanium or chromium, to promote adhesion between the metallic material and the dielectric, or between the metallic material and the insulating film if there is one between the absorber element and the thermometric element. This adhesion layer allows the materials used to be chosen from a wider range that includes materials that adhere weakly to one another. The MIM structure 305 is advantageously substantially rectangular and preferably square and has at least one lateral dimension that is selected in order to generate a plasmon resonance with the incident radiation at a frequency contained in said spectral band. Advantageously, the films have substantially identical lateral dimensions. The metal films 309 and 311 and the dielectric film 310 have submicron-order thicknesses that are advantageously selected in order to generate plasmon resonances with the incident radiation, the resonances being coupled to the dielectric/metal interfaces, as will be described in detail below. The MIM structure is for example positioned in the vicinity of the centre of the microbolometer pixel 300. The thermometric element 304 has, in this example, lateral dimensions that are substantially identical to those of the absorber element to provide a good thermal contact with the absorber element.

Advantageously, the supporting substrate 303 is covered with a reflector 302, for example made of gold or aluminum, placed a distance d away from the MIM structure, the distance d being chosen in order to form a second cavity between the plane of the MIM absorber 305 and the reflector. The distance d, which is chosen to be about $\lambda/4$ in prior-art bolometers, may be optimized to take into account the plasmon resonance mechanisms, as will be described below.

Advantageously, the thermometric element 304 and the insulating arms 306 are made of the same material or multilayer of materials. Advantageously, a material having an electrical resistance that varies greatly with temperature will be chosen. Typically, a material having a relative electrical-resistance variation of about ±2%/K and a low level of noise is chosen. This material will for example be chosen from amorphous silicon (a-Si), a silicon-germanium alloy, or a compound based on vanadium oxide.

FIGS. 4A to 4G illustrate in greater detail the optimization of an MIM structure for an absorber of a microbolometer according to the invention.

Figure 4A:
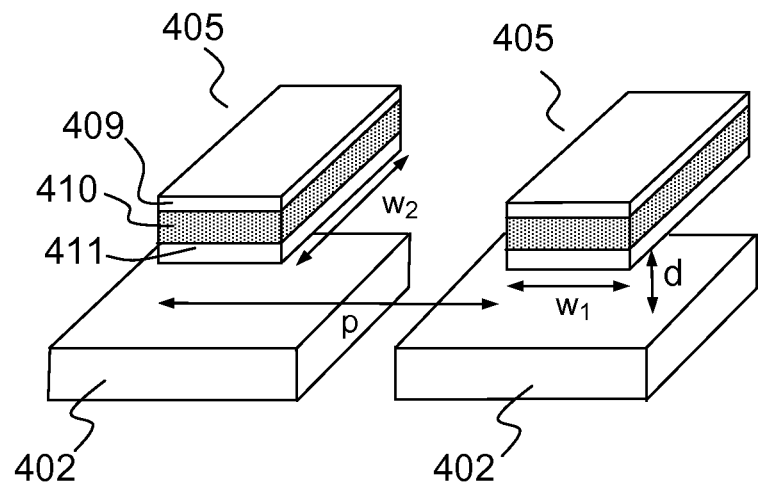
FIG. 4A, a schematic of an exemplary embodiment of an absorber using a single MIM structure suited to a microbolometer pixel according to the invention.

FIG. 4A shows, in a general way, a set of rectangular MIM structures 405 having a first lateral dimension $w_1$ and a second lateral dimension $w_2$, the MIM structure facing a reflector 402 deposited on the support substrate (not shown) of the microbolometer pixel, and located a distance d away from the absorber 405. The dimension $w_2$ is assumed to be very much greater than the dimension $w_1$ such that the MIM structures may be considered to be semi-infinite strips, the lateral dimension $w_1$ being the only characteristic dimension defining the resonant wavelength. Typically, the largest dimension of the absorber element will extend over almost the entire length of the pixel. Each absorber element 405 comprises a three-film metal/insulator/metal multilayer. In FIG. 4A, the MIM structures of only two microbolometer pixels are shown, each MIM structure being located in the vicinity of the centre of a pixel. The other elements of the microbolometer pixel (thermometric element, thermally insulating arms, electrical connections, substrate, etc.) have not been shown. The MIM structures 405, due to the arrangement of the microbolometer pixels in an array, are distributed periodically with a pitch p that is equal to the size of a pixel.

It is known (see for example Le Perchec et al. "Plasmon-based photosensors comprising a very thin semiconducting region", Applied Physics Letters 94, 181104 (2009) or French patent application FR 2,940,522) that an MIM structure in the form of a strip (having a length that is very much greater than its width) behaves, to a first approximation, as a longitudinal Fabry-Perot cavity between the two metal sheets, the resonant wavelength $\lambda_r$ of the cavity being given by:

$$\lambda_r = 2n_{\mathit{eff}} w \quad \text{(Equation 3)}$$

where w is the lateral dimension (or width) of the MIM structure and $n_{\mathit{eff}}$ is the effective refractive index of the MIM cavity.

Since the value of the effective refractive index is necessarily greater than 1, it would appear, in light of equation 3, that the lateral dimension of the MIM structure must be smaller than half the wavelength of the desired resonant wavelength. In practice, it will be sought to optimize the structure in order to obtain effective refractive indices that are substantially greater than 1. In particular, high-index dielectrics will be chosen. For example, to optimize a structure for band III operation, the dielectric may be chosen from zinc sulphide (ZnS), yttrium trifluoride (YF$_3$), silicon nitride (SiN$_x$), silicon oxide (SiO$_x$), silicon oxynitride (SiO$_x$N$_y$), amorphous germanium (a-Ge), amorphous silicon (a-Si) and an amorphous alloy of silicon and germanium (a-SiGe).

The structure is optimized by means of known computer codes, for example 1D or 2D Reticolo Software© developed by P. Lalanne and J. P. Hugonin (copyright © 2005 IOTA/CNRS) or the software package Comsol Multiphysics© developed by Comsol®.

The Applicants have shown that the structure may be optimized, in order to obtain maximum absorption at the desired wavelength, in the following way. In a first step, the lateral dimension of the structure is estimated, as a function of the desired resonant wavelength and the refractive index of the dielectric chosen for the dielectric film, based on equation (3) and using the real refractive index of the dielectric. In a second step, it is sought to optimize the thickness of the dielectric film, in order to maximize absorption, by first choosing a sufficiently large metal thickness for the films 409 and 411 (typically greater than a few hundred nanometers). Then, in a third step, it is sought to optimize the distance d to the reflector 402 when the latter is present. Next (fourth step), the minimum metal thickness enabling total absorption is calculated. Finally, the lateral dimension of the structure w is modified in small increments in order to obtain the desired resonant wavelength (fifth step).

Figure 4B:
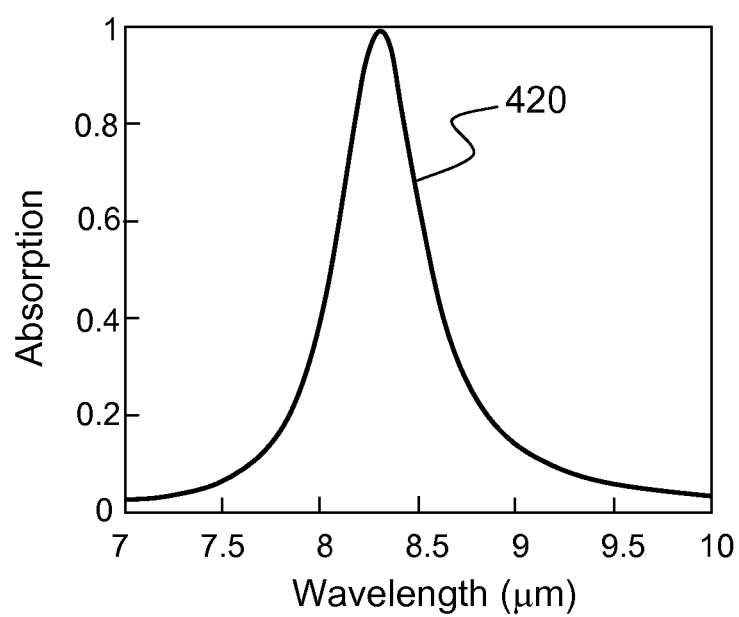
FIG. 4B, a graph showing the absorption obtained with this structure as a function of wavelength.

FIG. 4B thus shows the absorption calculated for MIM structures of the type in FIG. 4A, these structures being rectangular in shape, having a pitch p, a lateral dimension (width) $w_1$ and a length $w_2$ that is large relative to the width so that the structure may be modeled using a one-dimensional model. In practice, it has been demonstrated that a one-dimensional model is perfectly well suited to bands the wavelengths of which are 5 to 10 times greater than the width. For rectangular structures with smaller lengths, or square structures, a 2D software program must be used; however, the optimization principles described above remain the same. The MIM structure was optimized for absorption in band III, around 8.5 µm. The calculations were carried out using a pitch p=7 µm. In this example, the metal chosen for the metal films 411, 409 was gold and the dielectric chosen for the dielectric film 410 was ZnS with a refractive index n=2.2. The films were 50 nm (film 411), 180 nm (film 410) and 50 nm (film 409) in thickness, respectively, and the distance between the MIM structure and the reflector 402 was d=4.5 µm. The MIM structure had a lateral dimension $w_1$=1.6 µm. The absorption curve shows maximum absorption of near 100% and a Q-factor, defined as the ratio of the wavelength of maximum absorption to the full spectral width at half-maximum, of about 15.

FIGS. 4C to 4H respectively show the influence of the lateral dimension w of the structure, of the dielectric thickness, of the thickness of the metal films, of the distance d between the plane of the structure and the reflector 402, of the angle of incidence and of the pitch, in a configuration similar to that of FIG. 4A, and with the same parameter values.

Figure 4C:
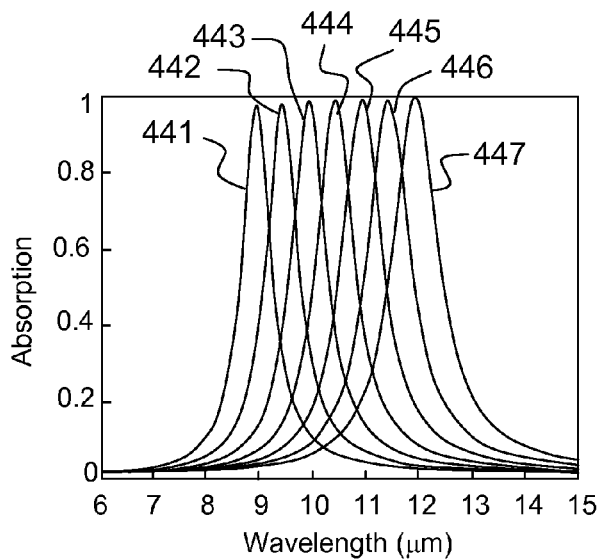
FIGS. 4C to 4H, graphs showing the dependence of the maximum absorption as a function, respectively, of the lateral dimension of the structure (FIG. 4C), the thickness of the dielectric film (FIG. 4D), the thickness of the metallic film (FIG. 4E), the width of the cavity (FIG. 4F), the angle of incidence (FIG. 4G) and the period (FIG. 4H)

Curves 441 to 447 in FIG. 4C were obtained by varying the lateral dimension $w_1$ of the absorber (405, FIG. 4a) between 1.7 µm and 2.3 µm, respectively, in steps of 0.1 µm. As expected, the resonant wavelength is observed to shift toward higher wavelengths, the resonant wavelength passing from a value lower than 9 µm to a value higher than 12 µm. These curves also show, by virtue of the small spectral width of the resonance (Q-factor of about 15), that a spectral filtering function may be obtained, all of band III possibly being swept.

Figure 4D:
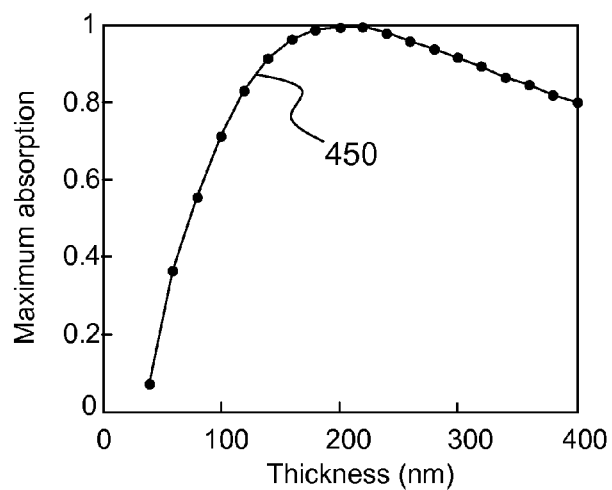

Curve 450 in FIG. 4D was obtained by varying the thickness of the dielectric film 410 for a lateral dimension $w_1$=1.6 µm. The Applicants have demonstrated that there is an optimum dielectric thickness at which absorption is maximized. During optimization of the structure it is therefore possible, once the approximate width of the structure (Equation 3) has been calculated, to define the optimal dielectric thickness, for a given dielectric, as described above. This curve also shows that there is a range of about ±10%, relative to the optimal dielectric thickness value, in which almost total absorption is obtained.

Figure 4E:
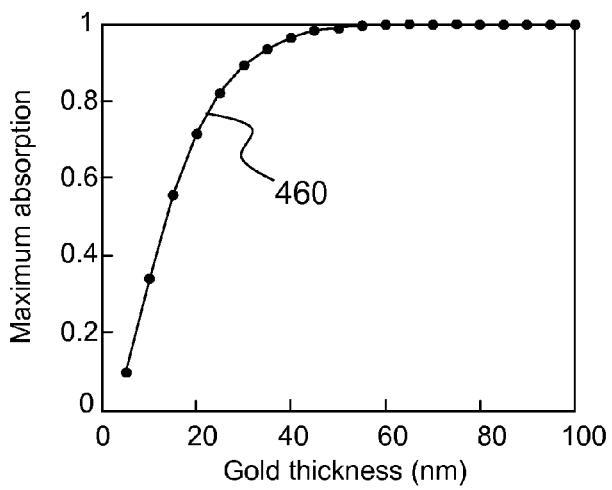

Curve 460 in FIG. 4E shows the effect of the thickness of the metal films 409 and 411 on the maximum absorption. Above a given threshold value total absorption is obtained. Below this threshold absorption decreases, the metal film no longer being thick enough to prevent light from passing straight through the MIM structure. To optimize the structure the minimum thickness value enabling maximum absorption will be chosen, typically between 40 nm and 60 nm in this example.

Figure 4F:
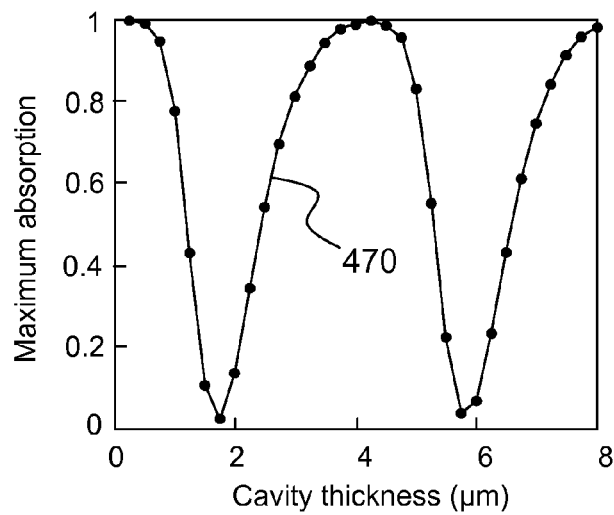

The curve 470 in FIG. 4F shows the dependence of the maximum absorption of the structure on the distance d between the plane of the absorber 405 and the reflector 402. In the absence of a reflector, the Applicants have demonstrated zero reflection by the MIM structure at the resonant wavelength but non-optimized absorption, part of the energy being transmitted and not absorbed by the MIM structure. Optimization of the thickness of the cavity ensures that all the energy is absorbed at resonance and therefore contributes to heating the thermometric element. Thus, in the example illustrated by FIG. 4F, maximum absorption is observed for a cavity having a thickness d of between about 3.5 µm and 4.5 µm.

Figure 4G:
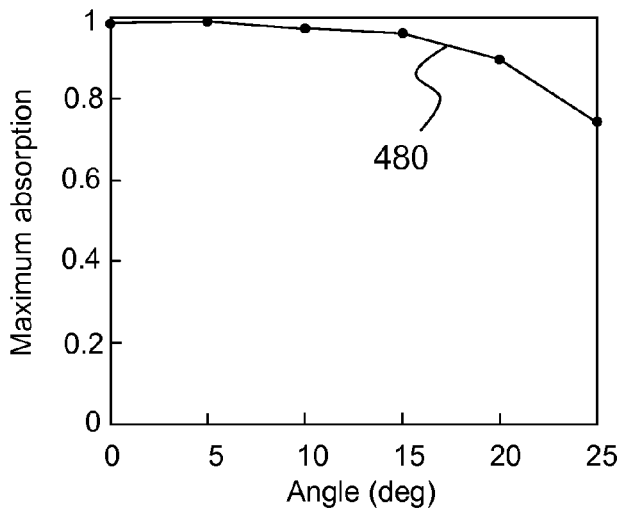

FIG. 4G shows the maximum absorption as a function of the angle of incidence of the radiation, under computational conditions similar to those used above. It is observed that the absorption is almost total up to angles of about 15° and decreases slowly thereafter. This result is noteworthy since the microbolometer pixel produced in this way has a very low sensitivity to the angle of incidence of the incident radiation, especially in the customary range of incidence of radiation on the detector.

FIGS. 4B to 4G thus illustrate the optimization of MIM structures for a given dielectric, in band III of the infrared. The same optimization methods will possibly be applied as a function of the dielectric chosen and on the spectral band desired for detection. For example, again for detection in band III, if the dielectric chosen is germanium, the refractive index of which is n=4, optimization of the structure in 1D for a resonant wavelength of 9 µm gives a lateral strip dimension of w=1.1 µm, a thickness for the metal, for example gold, films of 60 nm, a thickness for the dielectric film of 260 nm, and a cavity thickness d=4 µm.

According to one variant, for example such as described in FIG. 4A, the MIM structures 405 form strips (length $w_2$ greater than width $w_1$) and only TM polarized radiation, i.e. radiation the magnetic field of which is parallel to the lines, is absorbed. The resonant wavelength is adjusted by adjusting the width of the strip, as was described above. Advantageously, it is possible for the MIM structures to be square in shape, so as to make the absorption independent of polarization. In this case, the resonant wavelength can be adjusted by varying the lateral dimension of the square. An example of such an embodiment is shown in FIG. 3A. According to another variant embodiment, the MIM structure may be rectangular in shape, having a first lateral dimension $w_1$ and a second lateral dimension $w_2$, the two dimensions being tailored to generate respectively a resonance at two wavelengths in the spectral band of interest. In this case, the operation of the microbolometer is polarized, with a resonance for each of the TE and TM polarizations. It is also possible to distribute MIM structures designed to resonate with different polarizations over the set of microbolometer pixels, thus allowing incident radiation with various polarizations to be selectively absorbed so as to deliver, for example, two images of a scene, namely a TE-polarization image and a TM-polarization image.

Thus, the choice of optimum parameters for the MIM structure—thicknesses of the metal films and dielectric film, nature of the dielectric, lateral dimensions of the structure—allows almost 100% absorption at the resonant wavelength or wavelengths, and this with a weak dependence on the angle of incidence and, if chosen, optional polarization dependence.

It has been shown that such an MIM structure behaves as an optical nano-antenna. It resonates at frequencies that are set by the geometry of the antennas. At resonance, with a suitable design, almost perfect absorption is observed. It has been demonstrated that the effective absorption area of the MIM structure thus optimized is of the order of the square of the resonant wavelength, for a square MIM structure. In the case of a strip-type MIM structure, the effective 1D absorption area is of the order of the resonant wavelength.

Figure 4H:
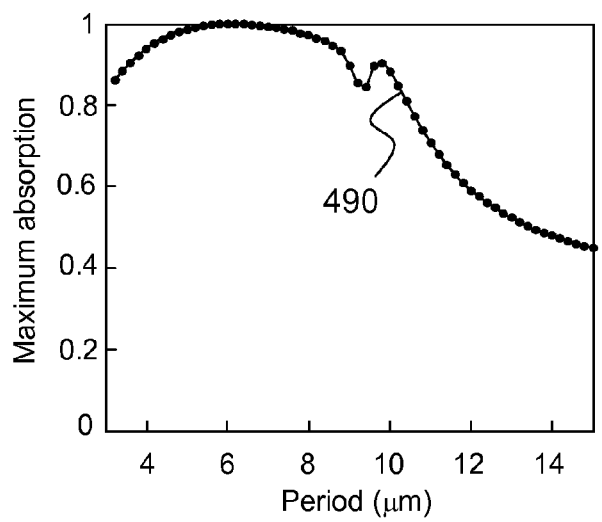

FIG. 4H shows the calculated maximum absorption curve 490 as a function of the pitch p, in a one-dimensional configuration such as that of FIG. 4A, with a dielectric (ZnS, refractive index n=2.2) film 180 nm in thickness, two metallic films made of gold 50 nm in thickness, a cavity width d=4.5 µm and a lateral strip dimension $w_1$=1.7 µm. The resonant wavelength was about 8 µm. When the pitch is smaller than the resonant wavelength, it is possible for all the incident photons to be absorbed and the absorption is maximized. When the pitch is greater than the resonant wavelength the maximum absorption decreases. This is because the spacing between the resonators (405, FIG. 4A) is greater than their effective area. This simulation, carried out in a one-dimensional configuration, thus confirms an effective 1D absorption area of about the wavelength. For a square resonator the effective absorption area will be of the order of the square of the resonant wavelength.

Using MIM structures optimized in the way described above thus allows the area of the absorber to be limited while retaining an effective absorption area of the order of the square of the wavelength. It is therefore possible to reduce the lateral dimension $L_p$ of the microbolometer pixel (see FIG. 3A) to substantially the value of the resonant wavelength so as to profit from an absorption area 307 that equals the area of the pixel (represented by the frame 313 in FIG. 3A), and therefore a fill factor near 100%, while ensuring that the lateral dimension of the membrane formed by the absorber and the thermometric element (301, FIG. 3B) is much smaller than that of the pixel.

Typically, with regard to Equation (3), the area of the membrane 301 forming the absorber/thermistor unit will be about $(\lambda/2n)^2$ for a substantially square MIM structure, where $\lambda$ is the wavelength of maximum absorption and n is the refractive index of the dielectric. It will be about $L_p \cdot \lambda/2n$ for a rectangular MIM structure the width of which is $\lambda/2n$ and the length of which is substantially the size of the pixel. Thus, in the first case, the area of the membrane will possibly be smaller than a quarter of that of the pixel, the refractive index n of the dielectric being greater than 1. This area will be limited to half that of the microbolometer pixel in the second case. In practice, the refractive index of the dielectric being greater than 1 and generally chosen to be greater than 2 and as much as 5, it is easy to see that, depending on the parameters of the MIM structure, the area of the membrane forming the absorber/thermistor unit will possibly be below 10%, or less, of that of the pixel.

The significant decrease in the size of the absorber may especially be used to design microbolometer arrays with small (i.e. about the same size as the detection wavelength) pixels for high-resolution infrared imaging. This decrease in the size of the absorber also makes it possible to increase the area of the thermal insulation (to more than 50% of the area of the microbolometer pixel), in contrast to prior-art microbolometer pixels in which the area of the absorber has to cover almost all of the area of the pixel. It is for example possible to increase the length of the insulating arms, thus increasing the sensitivity of the microbolometer.

In the case where the microbolometer pixels are larger than the average wavelength of the spectral band of interest, several MIM structures may be arranged over the area of the pixel, such that the effective absorption area covers the entire area of the pixel (as will be shown in the example of FIG. 8D described below). However, again, in this case, the area of the microbolometer pixel covered by the absorber elements will be much smaller than the total area of the pixel, making it possible to use a larger area for thermal insulation.

The extra space freed up in the area of the pixel may for example be used to increase thermal resistance, for example by making the insulating arms longer as shown in FIG. 3A, thus increasing the sensitivity of the microbolometer. Moreover, the area of the thermometric element, advantageously limited to that of the absorber with which it makes contact, is reduced. Thus the mass of the thermometric element is also reduced, thereby allowing its heat capacity (directly related to its mass) to be reduced, decreasing the response time.

Alternatively, shorter thermally insulating arms may be chosen if it is decided to decrease the response time.

According to another variant embodiment, the thermometric element, on the one hand, and the thermally insulating arms, on the other, may be produced by means of structured films.

Figure 5:
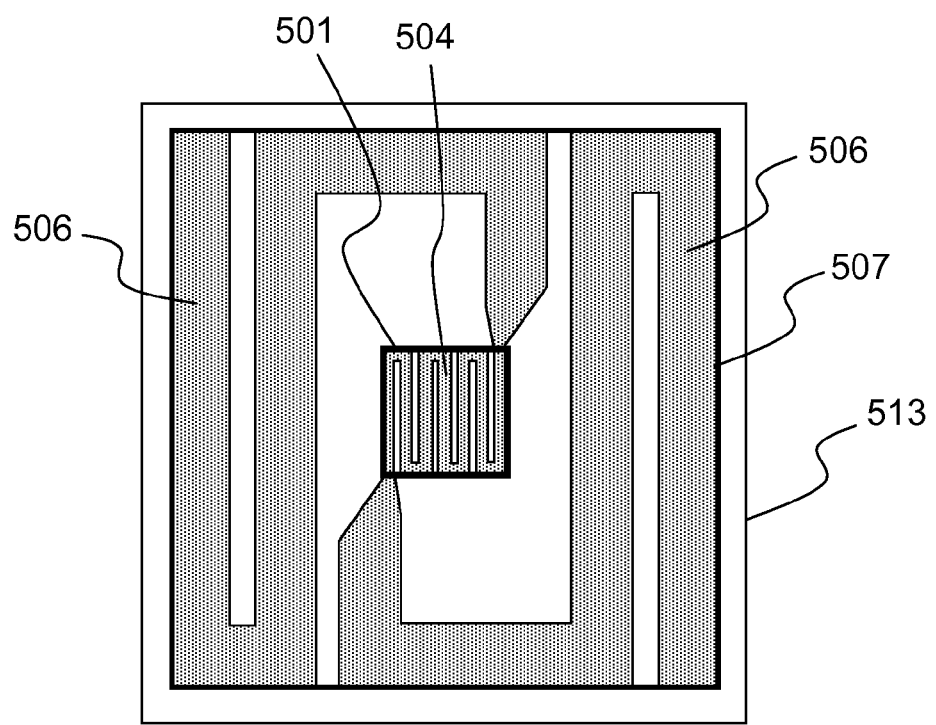
FIG. 5, an exemplary embodiment of a structured film that can be used to form the thermoelectric element and the insulating arms in another embodiment of a microbolometer pixel according to the invention.

FIG. 5 illustrates an exemplary microbolometer pixel the area of which is bounded by the frame 513, the microbolometer pixel comprising a membrane 501 that forms the absorber/thermistor unit. The thermistor or thermometric element, given the reference 504, makes contact with the absorber, not shown in this figure. In this example, a given film, comprising a material or a multilayer of materials, is structured in order to form on one hand the thermometric element, and on the other hand the insulating arms. In this example, the film, in its part forming the thermometric element 504, is structured so as to maximize the area of contact between the absorber and the thermometric element while increasing the electrical resistance of the latter. For example, the film, in its part forming the thermometric element 504, is structured in the shape of a serpentine the length of which is much greater than its width. The total electrical resistance of the microbolometer is the sum of the electrical resistance of its insulating arms and that of the thermistor. However, it is the latter that varies the most under the effect of the absorbed radiation, the electrical resistance of the insulating arms varying only partially under the effect of the temperature gradient that develops across its respective ends, one of these ends being connected to the thermometric element and the other being connected to the anchoring point making contact with the supporting substrate. Structuring the thermometric element thus allows its contribution to the total electrical resistance to be increased, and therefore the response of the microbolometer pixel to be improved. It is also possible to increase this contribution by increasing the electrical conductivity of the part of the film that forms the thermally insulating arms, for example by locally doping the film by ion implantation, if it is a semiconductor film.

By way of example, in the case of a microbolometer pixel of the type illustrated in FIG. 3A or 5 the side dimension of which is chosen to equal 12 µm, insulating arms 1 µm in width and having insulating gaps between the turns of 1 µm, the thermal resistance of each arm will then be about 25 squares (i.e. each arm will have a thermal resistance equal to 25 squares of the given material of the same thickness, placed in series). The serpentine in FIG. 5 will possibly be 0.2 µm in width and have insulating spaces between the turns 0.2 µm in width so as to obtain an electrical resistance of 60 squares.

As demonstrated above, optimized MIM plasmonic structures are regions of plasmon resonances which allow a quasi total absorption of light at the resonance wavelength. The shape of the spectral response of an MIM structure may moreover be changed as required by combining a number of different resonators. The examples described below will show various variant embodiments thereof.

Figure 6A:
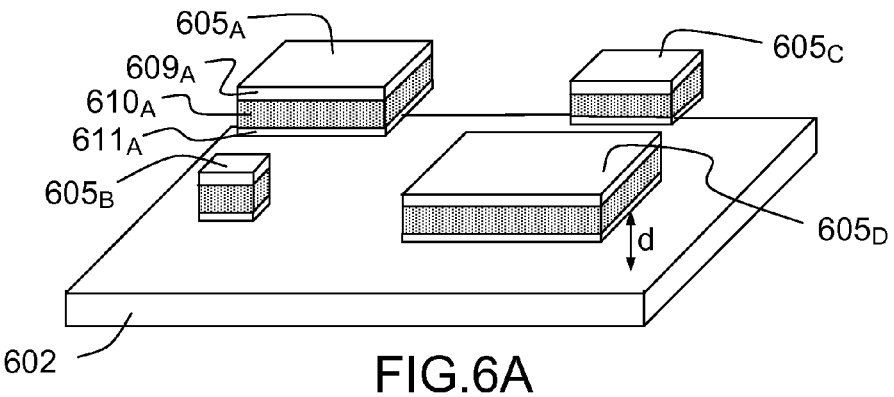
FIGS. 6A to 6C, examples of multiple MIM structures suited to variants of the microbolometer pixel according to the invention.
Figure 6B:
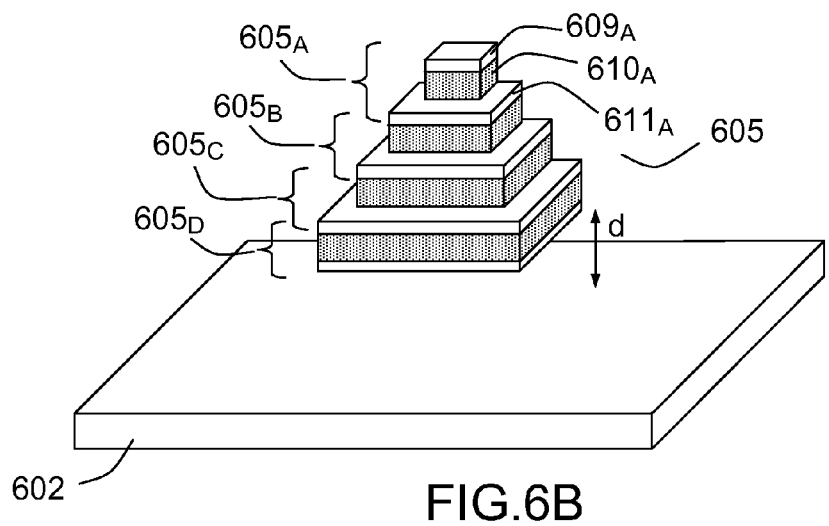
Figure 6C:
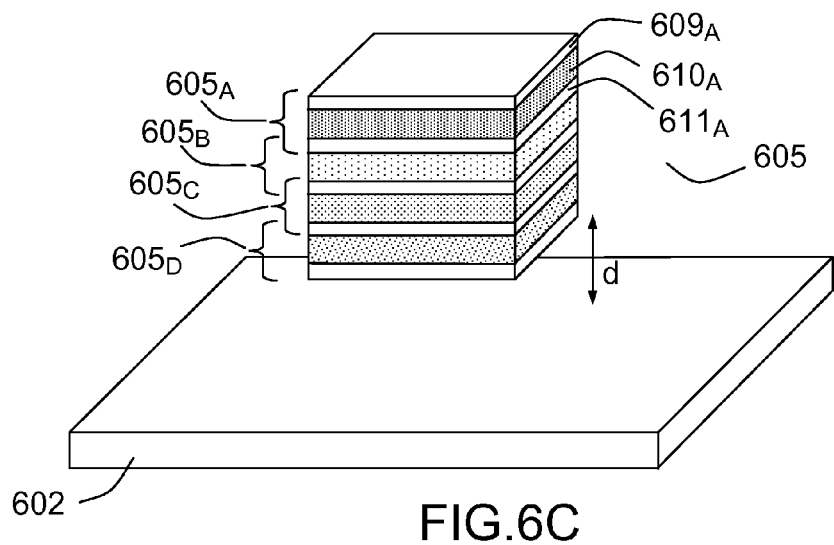

FIGS. 6A to 6C show three schematics of a microbolometer pixel in which the membranes forming the absorber/thermistor unit have particular structures allowing the spectral response of the microbolometer array to be adjusted. In this figures, as in FIG. 4A, only the absorber and the reflector are shown. In these examples, the MIM absorber is complex and formed by a plurality of simple absorbers that resonate at various wavelengths.

In a first example illustrated in FIG. 6A, the absorber comprises a plurality of MIM structures, denoted $605_A$ to $605_D$, spatially distributed over all of the area of the microbolometer pixel. These structures are located in the same plane, located a distance d from the reflector 602 deposited on the supporting substrate (not shown). Each MIM structure comprises a multilayer of three films 609, 610, 611, i.e. a first metallic film 611, a dielectric film 610 and a second metallic film 609. Preferably, the thicknesses of these three films will be the same for the various MIM structures. Each MIM structure is for example optimized, using the steps described above, to almost completely absorb a wavelength in the desired spectral absorption band. The absorption wavelength is especially defined by the lateral dimensions of the MIM structures. Thus, in this example, the MIM structures are square, each with a different lateral dimension, so as to obtain a resonance at a different wavelength in the spectral band. The microbolometer array thus obtained is polarization independent. Each MIM structure has an effective absorption area of the order of the square of the resonant wavelength, and therefore much larger, typically 4 to 20 times larger, than the actual area of the absorber. In a microbolometer array comprising an array of said microbolometer pixels, each of the MIM structures, due to the arrangement of the pixels in an array (not shown), are periodically repeated over the all of the bolometer, with a pitch corresponding to the size of the pixel. Absorption of photons incident on the entire area of the microbolometer array can thus be ensured at the absorption wavelengths of each of the MIM structures. For example, with 4 different MIM structures per pixel, optimized for 4 different wavelengths, as illustrated in FIG. 6A, it is possible to obtain a wide-band absorption in the spectral band of interest.

FIG. 6B shows a variant in which the absorber 605 is also complex, with a plurality of different MIM structures $605_A$ to $605_D$; however, the MIM structures in this example, instead of being spatially distributed over the area of the pixel, are stacked one on top of the other. Thus, in this example, the first metal film $611_A$ of the first MIM structure $605_A$ forms the second metal film $611_B$ of the second MIM structure $605_B$, etc. In this example, the MIM structures $605_A$ to $605_D$ have, as in the example of FIG. 6A, different lateral dimensions, enabling absorption at various wavelengths in the spectral band used by the detector. Advantageously, the multilayer of MIM structures is placed substantially in the vicinity of the centre of the microbolometer pixel. In this way, the effective absorption area covers all or almost all of the area of the pixel, making it possible to guarantee a fill factor near 100% for each of the absorption wavelengths.

FIG. 6C shows a third variant in which, as for FIG. 6B, the MIM structures are stacked. In this variant, the nature of the dielectric material varies from one MIM structure to another, so as to modify the resonant wavelength, and the lateral dimensions of the MIM structures may optionally be substantially identical, for a greater flexibility in the choice of the wavelengths absorbed.

Although the examples in FIGS. 6A to 6C have been shown with square MIM structures, it is, however, entirely possible to produce the same type of microbolometer pixel with rectangular MIM structures. In this case, the structures will no longer be insensitive to polarization. Optionally, it is possible to optimize the lateral dimensions of the structures in order to obtain different absorption wavelengths for each (TE or TM) polarization. Other shapes may be envisaged for the MIM structures, for example they may be triangular or hexagonal, in order to adjust the polarization response of the microbolometer pixel.

Figure 7A:
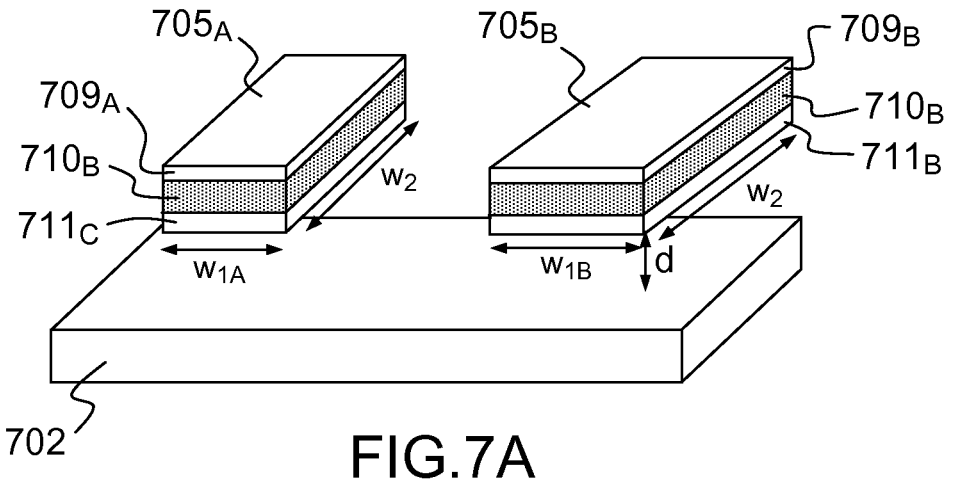
FIG. 7A, a schematic of an exemplary embodiment of a complex absorber using a double MIM structure, suited to a microbolometer pixel according to the invention.

FIG. 7A shows an exemplary embodiment of an absorber comprising two MIM structures $705_A$ and $705_B$. In this example, as in that in FIG. 4A, only the absorber elements and the reflector 702 have been shown. Moreover, the MIM structures have a length $w_2$ that is very much greater than their width ($w_{1A}$, $w_{1B}$), and that is typically about the same length as the pixel, such that the structures may be modeled as semi-infinite strips. In this example, the two MIM structures are arranged in the same microbolometer pixel. Once the microbolometer array has been produced with the array of microbolometers, the structures $705_A$ on the one hand and $705_B$ on the other hand, are arranged periodically with a pitch corresponding to the size of the pixel.

Figure 7B:
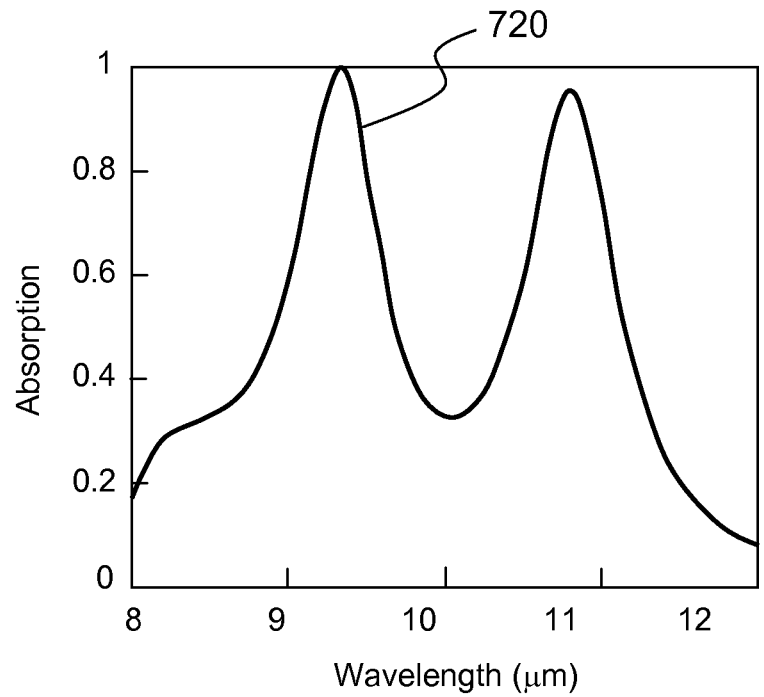
FIG. 7B, a graph showing absorption as a function of wavelength in the example in FIG. 7A.

FIG. 7B shows the absorption curve 720 obtained with a microbolometer of the type shown in FIG. 7A, as a function of the wavelength, for strip widths $w_{1A}$=1.8 µm and $w_{1B}$=2.1 µm, a pitch p=6 µm, a cavity thickness d=4.6 µm, metal films 50 nm in thickness and a dielectric film 190 nm in thickness, for a dielectric with a refractive index of 2.2. This curve has two absorption peaks, at resonant wavelengths of about 9.5 and 11 µm, respectively, showing the feasibility of shaping the spectral band.

FIGS. 8A to 8D show top views of other exemplary embodiments of microbolometer pixels according to the invention. Identical elements have been given the same reference numbers.

The microbolometer pixels are bounded by the frame 813, whereas the frame 807 represents, in each figure, the effective absorption area. The supporting substrate has been given the reference number 803. As in FIG. 3A, it has been equipped with a read-out circuit (not shown) and electrical connection pads 815 for connecting the thermometric element to the read-out circuit.

Figure 8A:
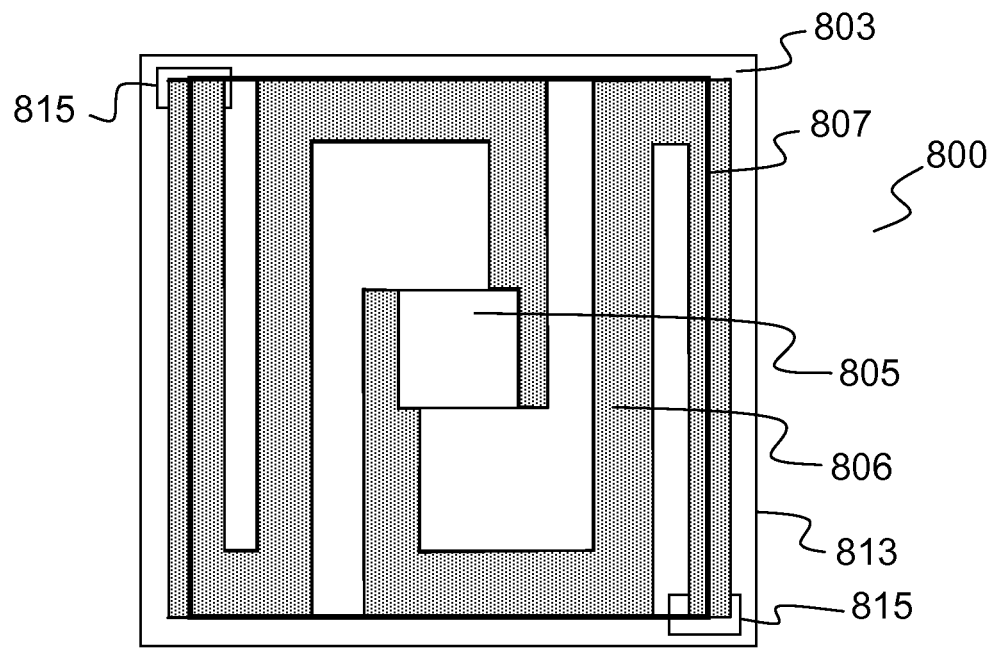
FIGS. 8A to 8D, schematic top views of microbolometer pixels according to other exemplary embodiments of the invention.

The example in FIG. 8A shows a microbolometer pixel 800 comprising either a simple absorber element 805, i.e. an element comprising a single MIM structure, or a complex absorber element 805, i.e. an element comprising a set of stacked MIM structures, such as shown in FIGS. 6B and 6C for example. The absorber element is advantageously located in the vicinity of the centre of the microbolometer pixel. The size of the pixel is of the order of the absorption wavelength of the structure, for example 12 µm for operation in band III. The spectral signature of the microbolometer array formed by pixels such as the pixel 800 may thus be narrow (simple absorber) or shaped (complex absorber). In FIG. 8A, the thermometric element, located under the absorber element, cannot be seen. Optimization of the MIM structure(s) forming the absorber allows effective absorption areas 807 to be obtained that are very much greater than the area of the absorber itself, making it possible to obtain effective fill rates near 100% and a very large insulating margin. In the example in FIG. 8A, this insulating margin is advantageously used to form longer insulating arms 806, increasing the thermal resistance and therefore the sensitivity. The increase in the response time that results therefrom is compensated for by the decrease in the heat capacity of the membrane, this decrease being due to the decrease in the mass of the thermometric element the area of which is limited to that of the absorber element.

Figure 8B:
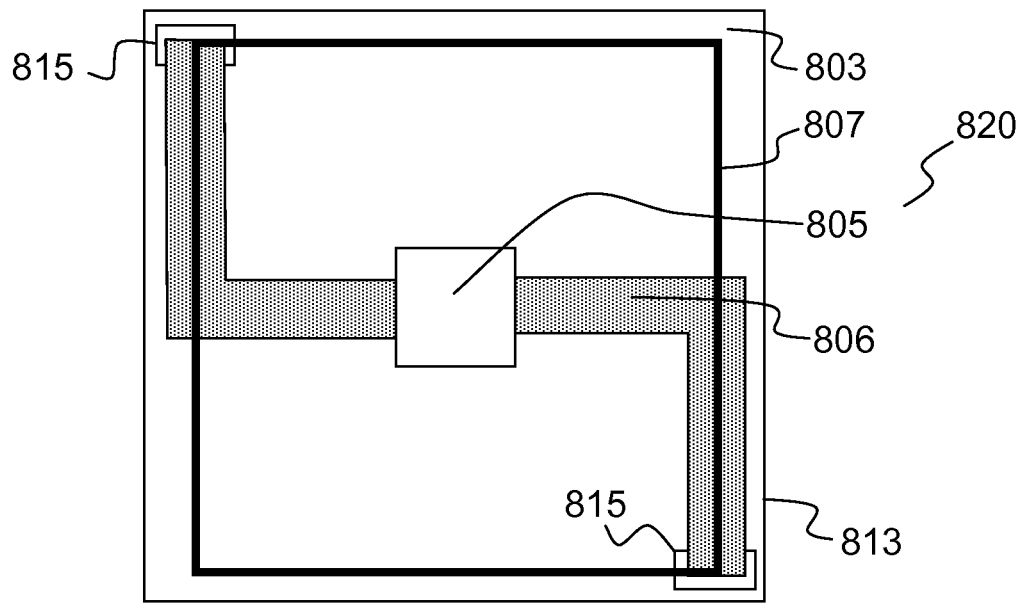

The microbolometer pixel 820 shown in FIG. 8B is similar to the microbolometer pixel 800 in FIG. 8A, the main difference being that the insulating arms 806 are shorter. This configuration benefits the response time over the sensitivity, for high-speed imaging applications.

Figure 8C:
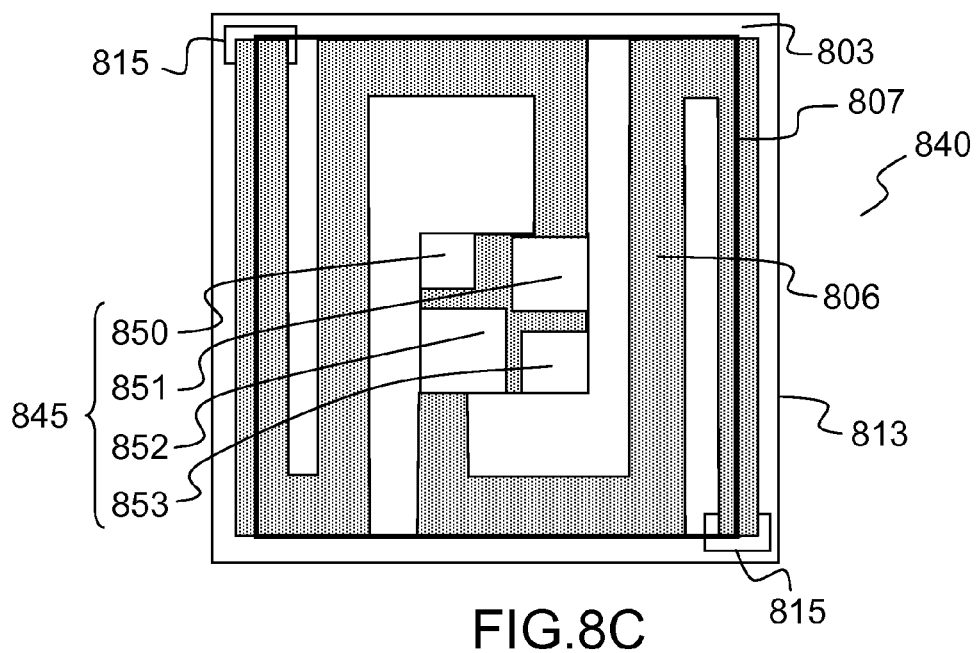

FIG. 8C shows a microbolometer pixel 840 in which the absorber 845 is complex, comprising a set of absorber elements 850, 851, 852 and 853. Each of these absorber elements may be a simple MIM structure or a multilayer of MIM structures, such as shown in FIG. 6B or 6C. It is possible to obtain, with such a pixel, a spectral response that is shaped over the entire spectral band of interest. Advantageously, the absorber elements are arranged in the centre of the pixel, each absorber element having, as in the preceding examples, an effective absorption area about the same as the area of the pixel. This configuration is therefore also appropriate for a small pixel, i.e. a pixel of the order of the average wavelength of the spectral band of interest in size.

Figure 8D:
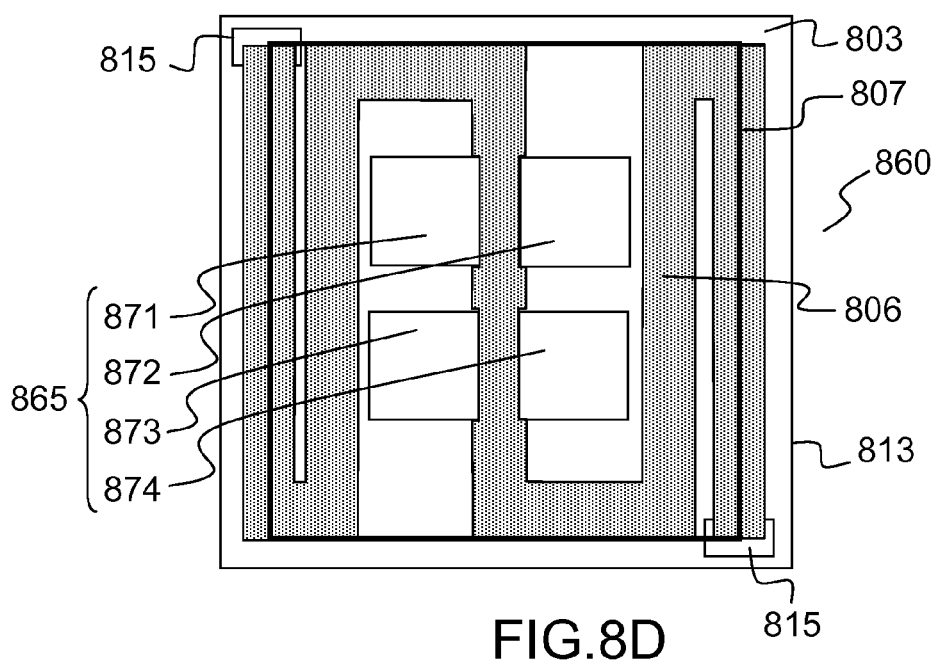

The example in FIG. 8D illustrates the case of a larger microbolometer pixel 860, for example 24 μm in size. In this case, the absorber 865 is formed by a set of identical absorber elements 871 to 874, each either formed by a simple MIM structure or a multilayer of MIM structures. Each of the absorber elements is optimized to present an effective absorption area that will cover part of the area of the pixel, for example quarter of the area of the pixel in the example of FIG. 8D, such that the set of four absorber elements has an effective absorption area 807 that covers, as above, the entire area of the pixel.

FIGS. 9A to 9F show schematics illustrating, according to one example, a method for fabricating a microbolometer array according to the invention. According to this example, all the microbolometer pixels of the microbolometer array are produced in the same process. In a first step (FIG. 9A), a metallic reflector 902, for example made of aluminum, is deposited on the upper surface of a supporting substrate 903, said substrate comprising a read-out circuit (not shown in FIG. 9A) and electrical connection pads 915 for connecting the thermometric element to the read-out circuit. The reflector is for example defined by photolithography/etching of the aluminum film. The reflector may for example form a continuous layer over all of the area of the substrate, with apertures provided for the connection pads. In a second step (9B), a sacrificial, for example polyimide, film 920 is deposited on the supporting substrate 903. This film will be used to form the suspended membrane. Its thickness is defined as a function of the height of the cavity that it is desired to form between the plane of the absorber and the reflector. Apertures are then formed in the sacrificial film 920, for example by dry etching, so as to allowing anchoring elements to be put in place (FIG. 9C). In the following step (FIG. 9D), a thermoresistive film, for example made of amorphous silicon, and an insulating film, for example made of silicon nitride, are deposited and the assembly 930 formed by the thermoresistive film and the insulating film is structured, for example by dry etching or by lift-off, in order to define the thermometric element and the insulating arms. The MIM structure 905 which will act as the absorber is then deposited (FIG. 9E), for example by lift-off, on the upper face of the insulating film of the assembly 930, in a region intended to form the thermometric element. The insulating film has the function of electrically insulating the thermoresistive film of the thermometric element from the metallic film 911 of the structure. The MIM structure comprises a multilayer of a first metallic film 911, a dielectric film 910 and a second metallic film 909, the dimensions of the films being optimized to absorb at the required wavelengths, as was described above. It may for example be a gold/ZnS/gold multilayer. Lastly, the sacrificial layer is removed (FIG. 9F), for example by dry etching, in order to form a membrane (904) suspended above the substrate by means of insulating arms 906 and anchoring elements 912, a cavity 908 being formed between the absorber 905 and the reflector 902.

In a first variant of the process, advantageously suited to the case where the thermometric element is made of a semiconductor, an operation for doping the part 930 intended to form the thermally insulating arms, for example by ion implantation, is introduced after the step shown in FIG. 9E. This local ion implantation may advantageously be self-aligned if the structure 905 is used as a mask for the implanted ions. It may also be obtained using a photoresist mask to limit the implanted regions to only those parts of the assembly 930 intended to form the thermally insulating arms.

In a second variant of the process, the anchoring elements are produced using an additional metallic film. To do this, after the step shown in FIG. 9B, the thermoresistive film, for example made of amorphous silicon, is deposited on the sacrificial film 920. The apertures produced in step 9C then pass through both the amorphous silicon film and the sacrificial film, in succession. The anchoring elements are put in place at this stage by depositing a single metallic, for example titanium, film or a set of metallic films consisting for example of titanium, titanium nitride and aluminum, which films are defined and structured by photolithography/etching so as to produce a mechanical and electrical link between the electrical connection pads 915 and the upper face of the ends of the amorphous silicon film. In the following step (FIG. 9D), an insulating, for example silicon nitride, film is deposited. The assembly formed by the thermoresistive film and the insulating film is then structured, for example by dry etching, so as to define the thermometric element and the insulating arms.

Another possible variant consists in extending the metallic film (optionally the metallic films) used to produce the anchoring elements over all or part of the thermally insulating arms. This option provides the arms with a low electrical resistance thereby possibly making the ion implantation operation of the first variant of the process redundant, which may be advantageous if the thermometric element is not a semiconductor.

Figure 10:
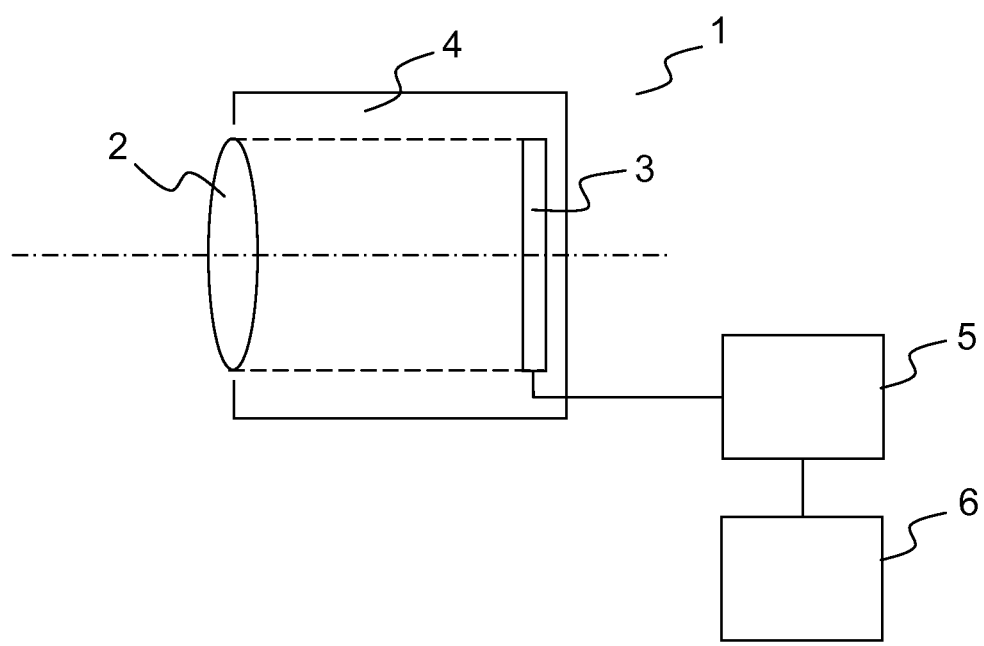
FIG. 10, a schematic showing a thermal camera incorporating a microbolometer array according to the invention.

FIG. 10 illustrates an exemplary camera incorporating a microbolometer array equipped with pixels according to the invention. The camera, for example intended for infrared imaging, comprises: input optics 2 for forming an image; the microbolometer array 3 placed in a vacuum package 4 in a focal plane of said optics 2, the package comprising a cap that is transparent at the wavelengths of interest; and electronics 5 for supplying power to the microbolometer array and for processing the signals delivered by the read-out circuit of the microbolometer array. A display 6 may be provided for displaying the images obtained. By virtue of the microbolometer array according to the invention, very high resolution images can be obtained (microbolometer pixel of the order of the wavelength in size) while maintaining a very good sensitivity.

Although described by way of a number of detailed exemplary embodiments, the microbolometer according to the invention comprises various variant embodiments, modifications and improvements that will be apparent to a person skilled in the art, it being understood that these various variant embodiments, modifications and improvements be within the scope of the invention such as defined by the following claims.

In particular, although most of the examples were described for operation in band III of the infrared, the invention is applicable to other spectral bands and in particular to spectral bands in the far infrared up to millimeter-wavelength ranges.

The invention claimed is:

1. A microbolometer array for thermal detection of light radiation in a given spectral band, comprising a supporting substrate and an array of microbolometer pixels of given dimensions, wherein each microbolometer pixel comprises:
 a membrane suspended above said supporting substrate by supporting elements, said membrane consisting of an element for absorbing the incident radiation and a thermometric element in thermal contact with the absorber, electrically insulated from said absorber element;
 elements for electrically connecting said thermometric element to the supporting substrate;
 thermally insulating arms arranged between the thermometric element and the supporting substrate;

and wherein:

the absorber element comprises at least one first metal/insulator/metal (MIM) structure comprising a multilayer of three superposed films of submicron-order thickness including a first metallic film, a dielectric film, and a second metallic film, said MIM structure being able to have a resonant absorption of said incident radiation at at least one resonant wavelength in said spectral band;

at least one lateral dimension of said MIM structure is smaller than or equal to $\lambda_r/2n$ where $\lambda_r$ is the resonant wavelength and where n is the refractive index of the dielectric material of the dielectric film in said MIM structure;

the lateral dimension of the MIM structure, the thickness of the dielectric film and the thicknesses of the first metallic film and second metallic film are determined as a function of the resonant wavelength and the refractive index of the dielectric material to have a maximum absorption at said resonant wavelength, resulting in an effective absorption area of said MIM structure at said resonant wavelength having at least one dimension of the order of the resonant wavelength; and the area of the microbolometer pixel covered by said membrane is less than or equal to half of the total area of the microbolometer pixel.

2. The microbolometer array according to claim 1, wherein said thermally insulating arms also form elements for electrically connecting the thermometric element.

3. The microbolometer array according to claim 1, wherein the thermally insulating arms and/or the thermometric element of each of the microbolometer pixels are/is formed in a structured film.

4. The microbolometer array according to claim 1, wherein the thermometric element of each of the microbolometer pixels is structured in the shape of a serpentine.

5. The microbolometer array according to claim 1, wherein the thermometric element of each of the microbolometer pixels comprises a material or a multilayer of materials chosen from amorphous silicon, a vanadium-based compound and a Si—Ge alloy.

6. The microbolometer array according to claim 1, wherein the thermometric element of each of the microbolometer pixels is insulated from the absorber element by an electrically insulating film.

7. The microbolometer array according to claim 1, wherein said first MIM structure of at least one of the microbolometer pixels is located substantially in the centre of the microbolometer pixel.

8. The microbolometer array according to claim 1, wherein, the absorber element of at least one of the microbolometer pixels comprises a plurality of said MIM structures, arranged on the surface of the microbolometer pixel.

9. The microbolometer array according to claim 8, wherein at least two of said MIM structures are different and able to have resonance absorption of said incident radiation at at least two separate wavelengths in said spectral band.

10. The microbolometer array according to claim 1, wherein the absorber element of at least one of the microbolometer pixels comprises at least one second MIM structure superposed on said first MIM structure, said first and second structures being able to have resonance absorption of said incident radiation at at least two separate wavelengths in said spectral band, and sharing a common metallic film.

11. The microbolometer array according to claim 1, wherein the dielectric film of said MIM structure of each of the microbolometer pixels is made from a material chosen from zinc sulphide (ZnS), yttrium trifluoride ($YF_3$), silicon nitride ($SiN_x$), silicon oxide ($SiO_x$), silicon oxynitride ($SiO_xN_y$), amorphous germanium (a-Ge), amorphous silicon (a-Si) and an amorphous alloy of silicon and germanium (a-SiGe).

12. The microbolometer array according to claim 1, wherein the first or second metallic film of said MIM structure of each of the microbolometer pixels is made of a material chosen from gold, copper, aluminium and silver.

13. The microbolometer array according to claim 1, wherein each of the microbolometer pixels furthermore comprises a reflector (302) placed at a distance d from the plane of said membrane, so as to form a resonant cavity at said wavelength.

14. The microbolometer array according to claim 1, wherein said supporting substrate comprises a circuit for reading the electrical resistance of the thermometric element of each of the microbolometer pixels.

15. A camera for detecting infrared radiation comprising image-forming optics, a microbolometer array according to claim 1 located in the vicinity of a focal plane of said optics, and a unit for processing the signals delivered by the circuit for reading the bolometer.

16. A method for producing a microbolometer array according to any one of the preceding claims, comprising:
    depositing a sacrificial film on a supporting substrate;
    forming apertures in said film in the location of elements for anchoring the microbolometer pixels;
    depositing a structured film in order to define, for each microbolometer pixel, the thermometric element and the thermally insulating arms;
    depositing the MIM structure(s) on each of the thermometric elements formed; and
    removing the sacrificial film.

17. The method for producing a microbolometer array according to claim 15, comprising, before the sacrificial film has been deposited, a step of depositing a reflective film structured to form, for each of the microbolometer pixels, a reflector element.

* * * * *